United States Patent
Nagayama et al.

[11] Patent Number: 5,952,037
[45] Date of Patent: Sep. 14, 1999

[54] ORGANIC ELECTROLUMINESCENT DISPLAY PANEL AND METHOD FOR MANUFACTURING THE SAME

[75] Inventors: Kenichi Nagayama; Satoshi Miyaguchi, both of Tsurugashima, Japan

[73] Assignee: Pioneer Electronic Corporation, Tokyo, Japan

[21] Appl. No.: 08/853,098

[22] Filed: May 8, 1997

Related U.S. Application Data

[62] Division of application No. 08/614,316, Mar. 12, 1996, Pat. No. 5,701,055.

[30] Foreign Application Priority Data

Mar. 13, 1995 [JP] Japan .................................. 7-053011
Nov. 10, 1995 [JP] Japan .................................. 7-293107

[51] Int. Cl.⁶ .................................................. B05D 5/06
[52] U.S. Cl. .......................... 427/66; 427/265; 427/282; 427/307; 427/404; 427/419.1; 427/419.3; 427/625.1

[58] Field of Search .............................. 427/66, 265, 404, 427/419.3, 419.1, 282, 307, 625.1; 216/13

[56] References Cited

U.S. PATENT DOCUMENTS

5,457,357 10/1995 Fujii et al. ................................ 313/506

*Primary Examiner*—Janyce Bell
*Attorney, Agent, or Firm*—Sughrue, Mion, Zinn, Macpeak & Seas, PLLC

[57] ABSTRACT

An organic electroluminescent display panel having a plurality of emitting portions includes; a substrate (2) on which a plurality of first display electrodes (3) corresponding to emitting portions are formed; electrical insulation ramparts (7) projecting from the substrate for exposing at least portions of the first display electrodes respectively; organic function layers (8) each including at least one organic electroluminescent medium formed on exposed portions of the first display electrodes; second display electrodes (8) formed on the organic function layers; and each electrical insulation rampart having an overhanging portion (7a) projecting in a direction parallel to substrate. The cathodes are patterned automatically without use of the photolithography.

8 Claims, 16 Drawing Sheets

FIG.7A

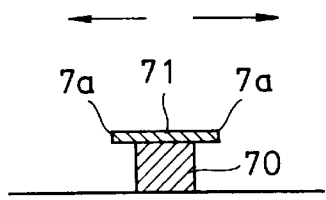

ARROWS INDICATE DIRECTIONS
OF OVERHANGING PORTIONS

FIG.7B

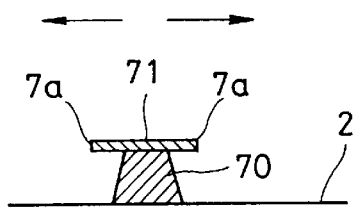

ARROWS INDICATE DIRECTIONS
OF OVERHANGING PORTIONS

FIG.7C

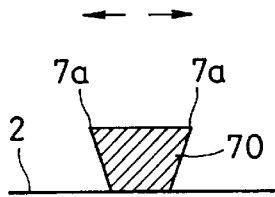

ARROWS INDICATE DIRECTIONS
OF OVERHANGING PORTIONS

FIG.7D

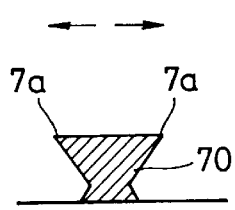

ARROWS INDICATE DIRECTIONS
OF OVERHANGING PORTIONS

FIG.7E

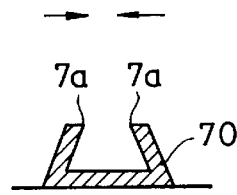

ARROWS INDICATE DIRECTIONS
OF OVERHANGING PORTIONS

FIG.7F

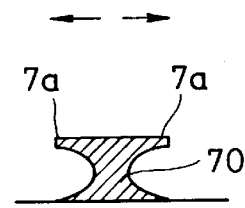

ARROWS INDICATE DIRECTIONS
OF OVERHANGING PORTIONS

FIG.7G

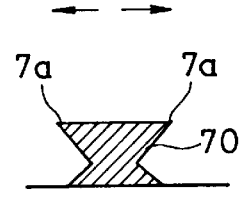

ARROWS INDICATE DIRECTIONS
OF OVERHANGING PORTIONS

FIG.7H

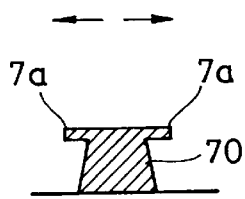

ARROWS INDICATE DIRECTIONS
OF OVERHANGING PORTIONS

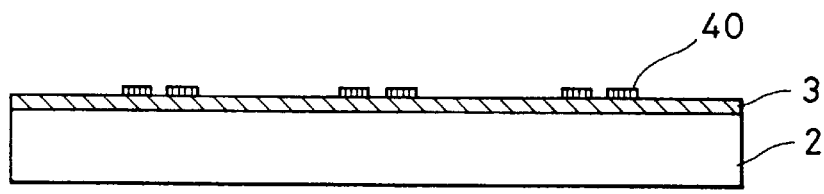
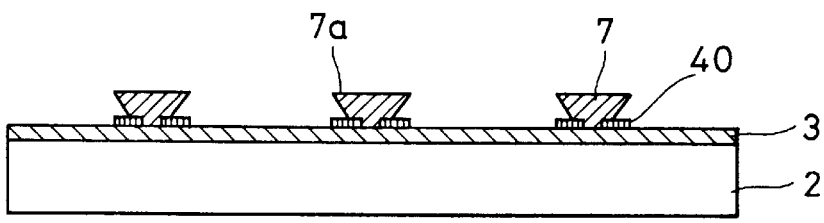
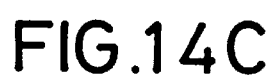
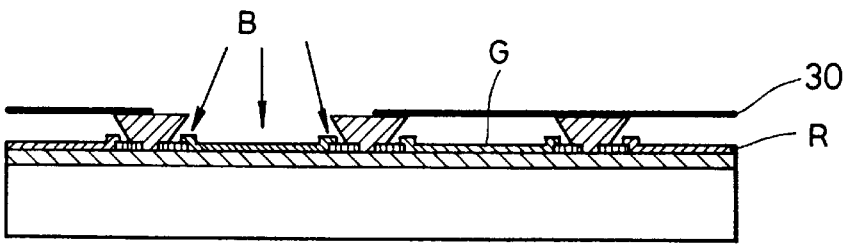
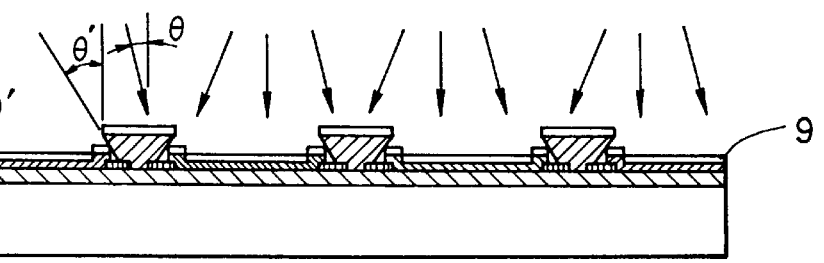

ORGANIC ELECTROLUMINESCENT DISPLAY PANEL AND METHOD FOR MANUFACTURING THE SAME

This is a divisional of application Ser. No. 08/614,316 filed Mar. 12, 1996 now U.S. Pat. No. 5,701,055.

BACKGROUND OF THE INVENTION

1. Field of the Invention

The present invention relates to an organic electroluminescent display panel used in a display apparatus and comprising a plurality of organic electroluminescent elements (also referred to herein as EL elements) each including an emitting layer made of an organic compound material, which utilizes an electroluminescence phenomenon that is the emission of light resulting from injection of an electric current to the emitting layer. More particularly, it is related to a full color display device comprising a matrix of the EL elements.

2. Description of the Related Art

Generally, the formations of the cathode and the organic function layers of EL media in the organic EL element are difficult in a micro-patterning art, since there are the low levels in durabilities of heat resistance (100° C. or less), wet-proof and solvent-resisting of the organic EL media used for the carrier injection layers, the emitting layer or the like in the function layers. If the ordinary photolithography patterning is utilized for the formation of such function layers of the organic EL element, the solvent in the photoresist infiltrates into the function layers of the EL element, to be damaged, and the organic EL element is damaged during the photoresist baking with a high temperature atmosphere, and further, the development solution or etching liquid for the photoresist layer also intrudes into the organic EL element, to be damaged. Even plasma in the dry-etching for the photoresist layer damages the organic function layers of the EL element. These damages cause the deterioration in the performance of the organic EL element and emission properties. This is a serious problem.

Alternatively, there is a vacuum deposit patterning by using a shadow mask to form the cathode and the organic function layers of the organic EL element. In this case, there are many problems in that the mask comes into contact with a substrate on which the organic function layers are formed. That is, the leakage of the vapor of organic EL media occurs between the mask and the substrate due to incomplete contact thereof. Otherwise, the shadow mask is compulsorily, sealingly put into contact with the substrate. In this case, the organic EL medium is damaged due to the contact of the forced mask during the EL medium deposition, and further the cathode to be deposited is deformed by the mask, to be short-circuited to the anode made of indium tin oxide (referred to herein as ITO) previously formed on the substrate. This direct contact of the mask and the substrate further causes deformities of the mask with precise fine patterns such as stripe cathode patterns because of insufficient strength of the mask with such stripe openings. Therefore, it is very difficult to form precise fine patterns for the cathode and the organic function layers of the organic EL element.

As full color display devices, there have been known emitting devices as shown in Japanese Patent Kokai Nos. 2-66873, 5-275172, 5-258859 and 5-258860, the latter of these three corresponding to U.S. patent applications Ser. Nos. 814512, 814163 and 814553 respectively. Each full color display device comprises a plurality of emitting pixels existing at intersections of lines and rows of matrix electrodes.

In the emitting device, the pixels are formed on a common transparent substrate with electrical insulation. The line electrodes made of transparent material are formed on the substrate and spaced from one another. These first transparent electrodes connect the adjacent pixels. Organic EL media are formed on the first electrodes and the substrate. The pixels include the second electrodes of row formed on the organic EL media respectively and spaced from one another. The second electrodes of row extend perpendicular to the first electrodes and connect the adjacent pixels respectively. In the emitting device, there is employed a simple matrix structure that the first and second electrodes sandwich the organic EL media at the intersections thereof.

Japanese Patent Kokai No. 2-66873 discloses a technology to avoid the forgoing problem of the infiltration of the photoresist solvent into the EL medium layer, that is, the photoresist comprising a specific solvent non-melting the organic EL medium is used in the photolithography patterning, and then the cathode pattern is etched by a dilute sulfuric acid to form the cathode. However, such an etching step is a problem in that the dilute sulfuric acid damages the previously formed organic EL medium layers on the substrate.

In the technology disclosed in Japanese Patent Kokai Nos. 5-275172, 5-258859 and 5-258860, such an emitting device is manufactured as follows: Straight higher walls with a height of several or tens micrometers as masks are previously formed on the substrate. The second electrodes and the organic EL medium thin films are vacuum-deposited by using such higher wall masks in such a manner that a predetermined organic EL medium vapor flow is provided in only one slanting direction to the substrate and partially and selectively shielded by the higher wall masks.

However, such a method restricts the flexible layout of pattern of pixels within a stripe shapes, since the wall masks must be formed perpendicular to the only one slanting direction of the organic EL medium vapor flow. Therefore, it is impossible to form a pixel pattern with a delta arrangement RGB in the panel nor any display panel with a bent or meandered cathode pattern.

Further, it is still difficult to form such higher wall masks on the substrate when fine pixels and patterns are fabricated for the full-color display panel, i.e., in detail it is very difficult to form the higher wall mask having a high aspect ratio (height/bottom) in its cross-section. Even if such higher wall masks are formed on the substrate, the strength of the wall will be low and the reliability in the performances and shapes of the resulting second electrodes and organic EL media films will be low. In addition, such a manufacture of the emitting device invites a complicated processing because of the slanting vapor flow deposition in one direction with a low precision.

SUMMARY OF THE INVENTION

Therefore, the present invention has been made to solve such a problem in view of the forgoing status. An object of the invention is to provide an organic electroluminescent display panel and method for manufacturing the same which are capable of being manufactured with a freely flexible patterning without deterioration of the organic function layer, cathode and other elements.

In accordance with a first aspect of the present invention, an organic EL display panel having a plurality of emitting portions comprises;

a substrate on which a plurality of first display electrodes corresponding to emitting portions are formed;

electrical insulation ramparts projecting from the substrate for exposing at least portions of the first display electrodes respectively;

organic function layers each including at least one organic electroluminescent medium formed on exposed portions of the first display electrodes;

second display electrodes formed on the organic function layers; and each electrical insulation rampart having an overhanging portion projecting in a direction parallel to the substrate preferably at an upper part thereof.

This organic EL display panel further comprises an insulative layer formed on portions of the first display electrodes to be under said overhanging portion and/or edges of the exposed portions of the first display electrodes, whereby the short-circuit between the first and the second display electrodes is prevented.

The forgoing organic EL display panel further comprises an insulative sealing film entirely formed on the first display electrode, the organic function layers and the second display electrode. At least the second display electrode is covered as a whole with the insulative sealing film, whereby the deterioration of the EL display panel is prevented.

In the forgoing organic EL display panel, said first and the second display electrodes are formed as stripes respectively, and each first display electrode is arranged perpendicular to each second display electrode.

In the forgoing organic EL display panel, the substrate and said first display electrode are transparent, and each second display electrode has a metallic luster, otherwise the organic EL display panel further comprises a reflective film formed on the second display electrode preferably.

In another embodiment of the organic EL display panel of the invention, when each of the second display electrodes is transparent, said first display electrode has a metallic luster, otherwise the organic EL display panel further comprises a reflective film formed on the first display electrode at the outer-side.

In accordance with a second aspect of the present invention, a method for manufacturing an organic EL display panel having a plurality of emitting portions comprises the steps of;

forming a plurality of first display electrodes corresponding to emitting portions on a substrate as a patterning step;

forming, on the substrate, electrically insulative ramparts for exposing at least portions of the first display electrodes and protruding from the substrate as a rampart formation step, said each electrical insulation rampart having an overhanging portion projecting in a direction parallel to the substrate preferably at an upper part thereof;

depositing organic electroluminescent media onto exposed portions of the first display electrodes respectively, thereby forming a plurality of organic function layers each including at least one organic electroluminescent medium on the first display electrodes; and forming a plurality of second display electrodes formed on the organic function layers.

In this method for manufacturing an organic EL display panel, said rampart formation step further comprises preferably the steps of;

forming entirely a rampart material layer on said substrate;

forming a photo mask with a predetermined pattern openings on the rampart material layer;

etching the rampart material layer through the openings of the photo mask by using a dry-etching or wet-etching, thereby forming the ramparts having said overhanging portions.

In the forgoing method for manufacturing an organic EL display panel, the organic electroluminescent media depositing step further comprises preferably the steps of;

putting a shadow mask onto top surfaces of the ramparts, the shadow mask having a plurality of openings corresponding to the exposed portions of the first display electrodes, while aligning the openings to the first display electrodes respectively;

depositing organic electroluminescent media through the openings onto the first display electrodes between the ramparts respectively; and repeating the mask putting and aligning step and the media depositing step in such a manner of that the shadow mask is shifted to an adjacent portion where the openings aligned to adjacent other first display electrodes, whereby enabling a high efficient manufacturing.

In this way, since the rampart protects the organic function layer during the formation thereof, there is decrease of damage of the organic function layer due to the shadow mask put thereon, even if there is performed a direct contact onto the rampart of the mask with insufficient strength and precise fine patterns such as stripe patterns. In addition, the use of the rampart and the shadow mask makes a sure separation of RGB organic function layers and shares the coatings of RGB organic media at a high precision.

Moreover, according to the present invention, the manufacture of the organic EL display panel further comprises preferably;

between said patterning step for said first display electrode and said rampart formation step, forming insulative layers on portions of the first display electrodes to be under said overhanging portion and/or edges of the exposed portions of the first display electrodes. The insulative layer formed at least at portions of the first display electrodes to be under said overhanging portion and/or edges of the exposed portions of the first display electrodes surely prevents the short-circuit between said first and the second display electrode.

Further, the forgoing method for manufacturing an organic EL display panel according to the present invention further comprises preferably the steps of;

after forming step of the second display electrode, forming entirely an insulative sealing film on at least the second display electrodes, so that the insulative sealing film is formed on the first display electrode. Said organic function layers and said second display electrode prevent any increasing of non-emitting portions caused by the deterioration in EL media of the organic EL display panel.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

The above set forth and other features of the invention are made more apparent in the ensuing Detailed Description of the Invention when read in conjunction with the attached Drawings.

BRIEF DESCRIPTION OF THE DRAWINGS

FIGS. 7A, 7B, 7C, 7D, 7E, 7F, 7G and 7H are enlarged cross-section views each showing a rampart on the substrate in an organic EL display panel according to the present invention;

FIGS. 14A, 14B, 14C and 14D are cross-section views showing substrates in a process of a fourth embodiment for manufacturing an organic EL display panel according to the present invention;

DETAILED DESCRIPTION OF THE PREFERRED EMBODIMENTS

The embodiments according to the present invention will be described in more detail with reference to the accompanying drawings.

Figure 1:
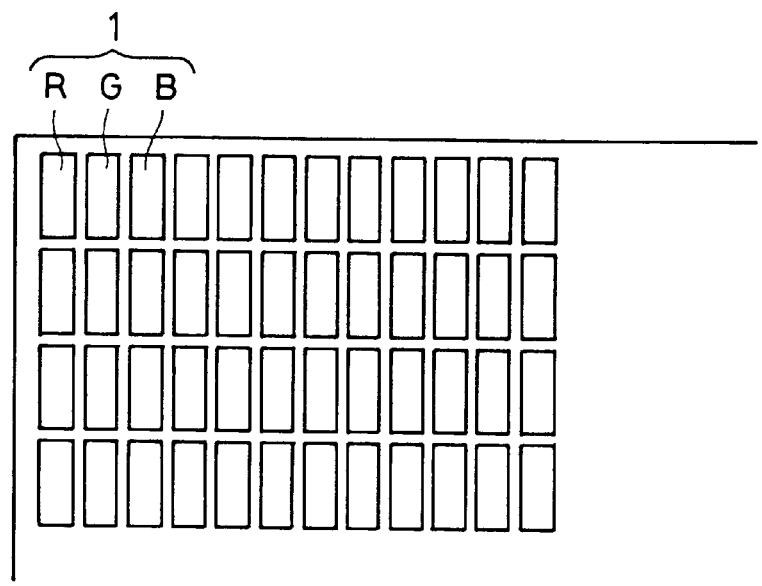
FIG. 1 is a partially enlarged simplified plan view of an organic EL display panel according to the present invention.

FIG. 1 shows a partially enlarged simplified plan view of an organic EL display panel of an embodiment which is provided with a plurality of emitting pixels 1 of matrix each having emitting portions for red (R), green (G) and blue (B) lights in order to display an image. This is seen through the substrate of the panel from the outside thereof. In addition, the organic EL display panel may be formed as a monochrome display panel comprising a single color emitting portions instead of RGB emitting portions.

Figure 2:
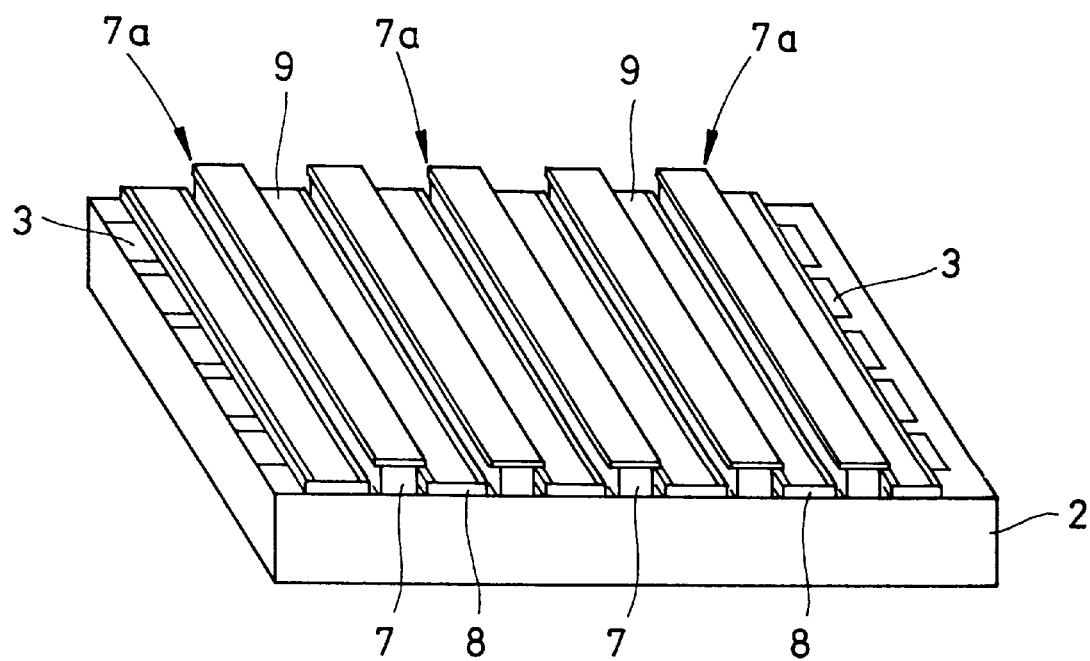
FIG. 2 is a partially enlarged perspective view of an organic EL display panel according to the present invention.

FIG. 2 shows a further enlarged perspective view of the backside of the panel in which the substrate 2 carries a plurality of first display electrodes or lines 3 arranged parallel to one another as stripes in a coplanar surface thereof.

Figure 3:
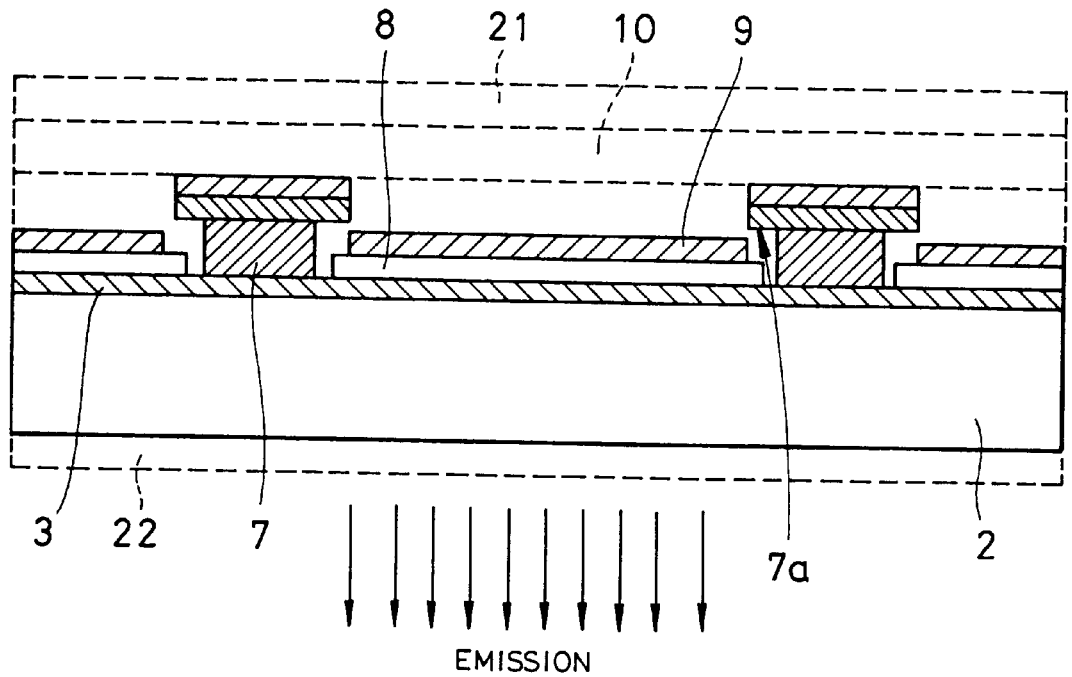
FIG. 3 is an enlarged cross-section view of an organic EL display panel according to the present invention.

Moreover, a plurality of ramparts 7 made of an electrical insulation material are formed on the substrate 2 so as to be arranged perpendicular to the first display electrode lines 3 and apart from each other, as shown in FIGS. 2 and 3. The electrical insulation ramparts 7 project from or stand on the substrate 2 and expose at least portions of the first display electrodes 3 respectively.

Each electrical insulation rampart 7 has overhanging portions 7a projecting in a direction parallel to the substrate at an upper part thereof. The overhanging portion 7a is formed along the extending edge of the rampart 7.

Between the ramparts 7, organic function layers 8 including at least one organic electroluminescent medium or compound are formed and arranged over the exposed portions of the first display electrodes 3. The organic function layer 8 includes three organic EL media thin films e.g., an organic hole transport layer, an organic emitting layer and an organic electron transport layer as a three-layer structure. The organic function layer 8 may alternatively include a two-layer structure comprising an organic hole transport layer and an organic emitting layer.

Second display electrodes 9 are formed on the organic function layers 8 of the organic electroluminescent medium respectively along the extending direction. In this way, the intersections of the first and second display electrode lines sandwiching the organic function layers correspond to light emitting portions respectively in the organic EL display panel of a simple matrix type.

On the second display electrode 9 of the panel, a protective film 10 or a protective substrate is formed preferably. In this organic EL display panel, the substrate and the first display electrodes are light transmissible, and thus the light emission radiates from the substrate. Therefore, as shown in dot lines in FIG. 3, a reflecting layer 21 may be preferably formed on the protective film 10 in order to improve the emitting efficiency. In contrast, the second display electrode may be made of a transparent material so as to emit light from the second display electrode in another embodiment of an organic EL display panel. In this case, another reflecting layer 22 may be preferably formed on the substrate 2 in order to improve the emitting efficiency.

A process for manufacturing the organic EL display panel is now described.

Figure 4:
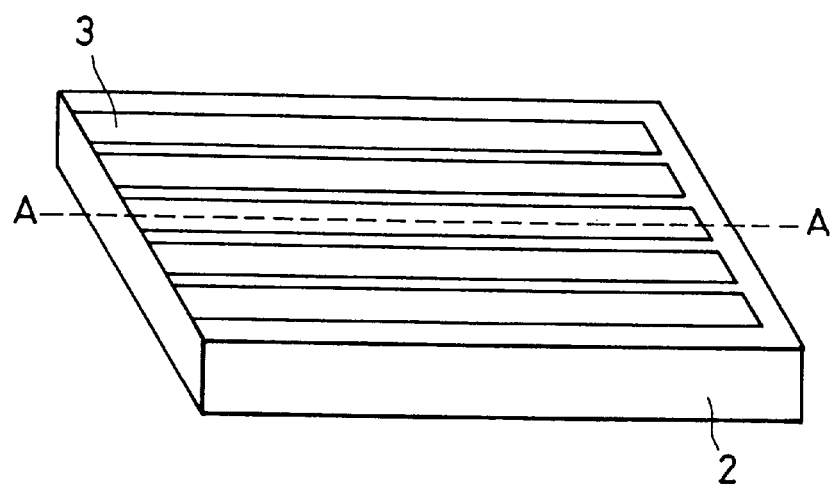
FIG. 4 is a perspective view of the substrate carrying electrodes in the organic EL display panel according to the present invention.

In a patterning step of the process, as shown in FIG. 4, a plurality of first display electrodes 3 of a stripe shape made of a transparent conductive material such as indium tin oxide (ITO) are formed parallel to each other on a transparent substrate 2 of glass by using a photolithography technology (e.g., 0.3 mm pitch, 0.28 mm width and 0.2 micrometers thickness).

Next, by using a spin-coating method in the rampart formation step, the first display electrodes 3 on the substrate 2 are entirely covered with a rampart material such as non-photosensitive polyimide 70 as a rampart layer up to a 3 micrometers thickness. Then second rampart material such as $SiO_2$ 71 for the overhanging portion is entirely formed on the rampart layer of polyimide 70 by using a sputtering method up to a 0.5 micrometers thickness.

Figure 5A:
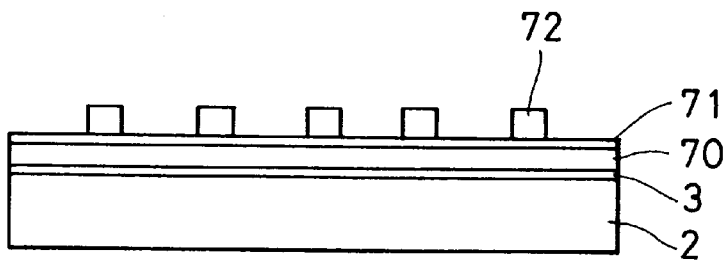
FIGS. 5A, 5B and 5C are cross-section views showing substrates in a process for manufacturing an organic EL display panel according to the present invention.

Next, as shown in FIG. 5A, the $SiO_2$ layer 71 is spin-coated with a photoresist as a mask layer up to one micrometer thickness, and then the mask 72 of photoresist each having a 20 micrometers width is formed by using an ordinary photolithography, so that the photoresist pattern for ramparts is formed.

Figure 5B:
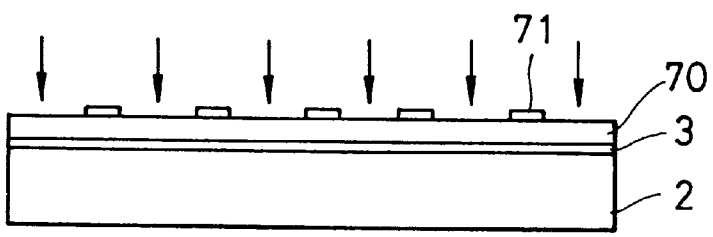

Subsequently, as shown in FIG. 5B, the $SiO_2$ layer 71 is selectively etched via openings of the mask 72 by a reactive-ion etching method so as to be the same photoresist pattern of ramparts, so that the upper portions to be overhanging portions are formed. In this reactive-ion etching, the etching gas of $CF_4$ is mainly used at the gas flow of 100 SCCM under the conditions of a 100 W RF power for 10 minutes for the purpose of completion of the etching.

Figure 5C:
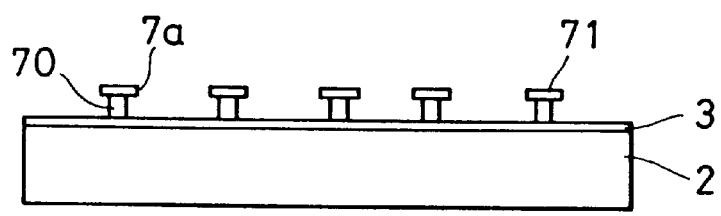

After that, as shown in FIG. 5C, the polyimide layer 70 is also selectively etched by using a dry-etching or wet-etching method, so that the body 70 of the rampart and overhanging portion 7a projecting in a direction parallel to the substrate at the top are formed. In this way, the rampart 7 consists of the body 70 of polyimide and the overhanging portion 71 of $SiO_2$ with a T-shaped cross-section as a whole. The height of the T-shaped cross-section rampart 7 from the substrate is not restricted as far as it does not provide any electric short-circuit between the individual ITO anode 3 and the individual second display electrode or cathode 9 which will be formed in the later process. Concretely, the height of the rampart 7 preferably ranges from one micrometer to 10 micrometers. In addition, the width of the overhanging portion 7a protruding from the body side of the T-shaped rampart 7 is sufficiently one micrometer or more, and the thickness of the overhanging portion is sufficiently 0.2 micrometer or more as far as they do not provide any electric short-circuit of the electrodes similarly.

Figure 6A:
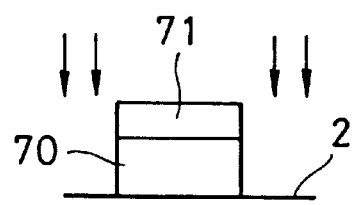
FIGS. 6A and 6B are enlarged cross-section views each showing a rampart on the substrate in a process for manufacturing an organic EL display panel according to the present invention.
Figure 6B:
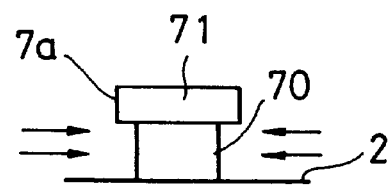

This T-shaped cross-section rampart 7 is formed through the reactive-ion etching as shown in FIGS. 6A and 6B in detail. First, the polyimide layer 70 is dry-etched by an $O_2$ gas perpendicular to the substrate without any undercut (anisotropic etching) as shown in FIG. 6A. After that, the polyimide layer 70 is wet-etched by an alkali solution for approximately 30 seconds so that the wall side of the rampart body of polyimide 70 is isotropically etched as shown in FIG. 6B. FIG. 7A shows the T-shaped cross-section of the rampart 7 resulting from this two-stage etching.

Alternatively, in another etching method for engraving the polyimide layer 70, the polyimide layer 70 is isotropically wet-etched merely by an alkali solution with a pertinent concentration for 1 to 2 minutes without the previous anisotropic etching, so that $SiO_2$ layer 71 services as a mask for etching of the polyimide layer 70 and then undercut shapes of sidewalls of polyimide are obtained because of a isotropically wet-etching, as shown in FIG. 7B.

The so-called polyimides stated above includes a precursor which is a previous substance before imidization such as aromatic. Such a precursor is heated up to approximately 300° C. after being casted as shown in FIG. 5C, so that imidization is complete to cause a thermally stable polyimide. The casted aromatic precursor may be used as it is as far as it maintains integrity without any inconvenience. Alternatively, instead of polyimide and $SiO_2$, pertinent materials disintegrated during the first or second-stage etching may be used for the rampart body of the upper and the overhanging portion of the lower respectively. The electric insulative materials having shape strength of the rampart even before the formation of the organic function layer also may be used for them.

FIGS. 7C to 7H show variations of cross-sections of the rampart instead of two-layer structure above mentioned. The reverse tapered cross-sections of the ramparts shown in FIGS. 7C and 7D are formed in such a manner for example that the photoresist layer is treated with $C_6H_5Cl$. There may be formed the other cross-sections of the ramparts shown in FIGS. 7E to 7H as far as overhanging portions exist.

After the formation of the ramparts, the organic function layer formation step is performed as shown in FIGS. 8A to 8D. The organic EL media are disposed on the exposed first display electrodes 3 respectively, so that at least one organic function layer is formed per one emitting portion. After that, in the second display electrode formation step, the second display electrodes are formed on the organic function layers. In the following figures, only one set of RGB emitting layers are shown for one pixel, but in practice a plurality of pixels are formed simultaneously in a coplanar plan of the substrate.

Figure 8A:
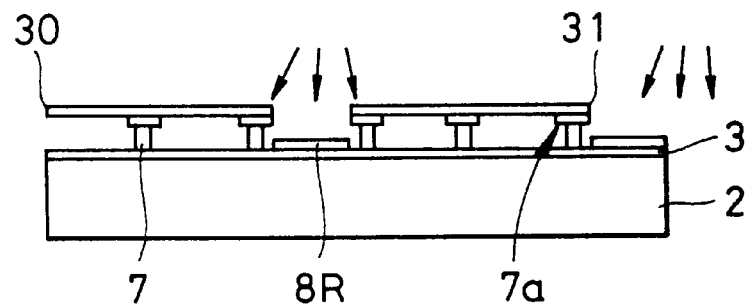
FIGS. 8A, 8B, 8C and 8D are cross-section views showing substrates in a process for manufacturing an organic EL display panel according to the present invention.

FIG. 8A shows in detail the organic function layer formation step. Openings 31 of the shadow mask 30 are aligned to portions of the substrate 2 each surrounded by the rampart 7 and the shadow mask is put and fixed onto top surfaces of the ramparts. After that, first organic function layers 8R for a first color emission (e.g., red) are vacuum-deposited at a predetermined thickness through the openings onto the first display electrodes 3 between the ramparts. The substrate is preferably placed during the vacuum-deposition in such a manner that the vapor of the organic EL medium goes around the overhanging portion and reaches portions under the overhanging portion. There is no restriction of angle of the substrate surface to the vapor flow. In this way, the first color organic function layers are formed on the first display electrodes respectively. In addition, in case that the organic function layer of the three-layer structure (e.g., an organic hole transport layer, an organic emitting layer and an organic electron transport layer) is formed, the corresponding different organic media may be vacuum-deposited in this step. In the later each step for the function layer, this multi-deposition may be performed similarly.

Figure 8B:
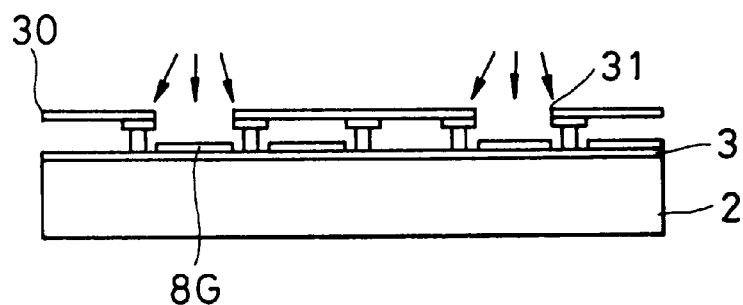

In the step of FIG. 8B, the shadow mask is shifted toward the left by one rampart so that the openings are aligned to the adjacent rampart spaces, and then the mask is fixed onto top surfaces of the ramparts. After that, second organic function layers 8G for a second color emission (e.g., green) are vacuum-deposited at a predetermined thickness onto the first display electrodes 3.

Figure 8C:
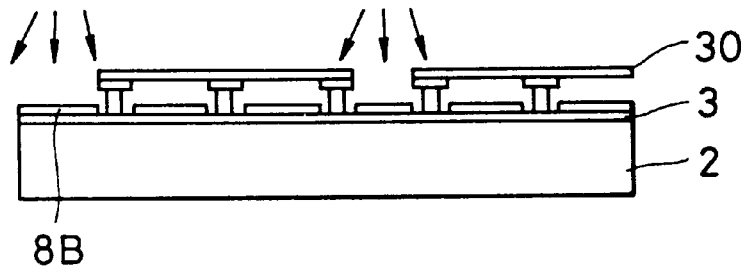

In the step of FIG. 8C, the shadow mask is similarly shifted toward the left by one rampart so that the openings are aligned to the adjacent rampart spaces, and then the mask is fixed onto top surfaces of the ramparts. After that, third organic function layers 8B for a third color emission (e.g., blue) are vacuum-deposited at the predetermined thickness onto the first display electrodes 3.

In this way, it is preferable that the mask putting and aligning step and the media depositing step are repeated in such a manner of that the shadow mask is shifted to an adjacent portion where the openings aligned to adjacent other first display electrodes, since the manufacturing of the panel is improved conveniently. The rampart 7 is useful to prevent the shadow mask from damaging the organic function layer when the aligning, shifting and putting of the mask are performed in the vacuum-depositions of the organic function layers.

Figure 8D:
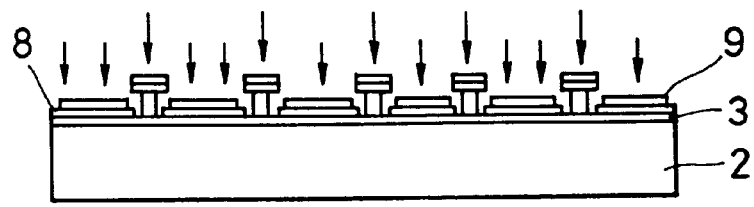

FIG. 8D shows a step for forming the second display electrodes 9 in which, after the shadow mask for the organic function layers are removed, a low resistance metal such as Al, Mg, Au and the like and an alloy thereof is vacuum-deposited as cathodes 9 with a predetermined thickness on the resulting RGB organic function layers 8 in such a manner that the metal vapor drops perpendicular to the substrate without step coverage. It is noted that the metal vapor flow is substantially vertical to the surface of the substrate so that the overhanging portion 7a of the rampart prevents the deposition of the metal thereunder on the edges of the organic function layer or at least, on the lower face of the overhanging portion per se.

The overhanging portion 7a of the rampart divides the metal layer deposited by the vertical metal vapor flow to the substrate, so that the cathode 9 is formed physically electrically apart from the metal layer deposited on the top face of the rampart as shown in FIG. 8D. Therefore, the adjacent cathodes 9 sandwiching the rampart are electrically disconnected from each other. Moreover, the combination of the vertical metal vapor flow and the overhanging portion also causes the electrical insulation between the cathode 9 and the ITO anode 3 to prevent a short circuit therebetween, since the metal vapor flow going around the overhanging portion 7a does not reach so far as the edge of the organic function layer 8 of the organic EL medium previously formed so that the organic function layer 8 appears from the cathode 9 as shown in FIG. 8D. Thickness of the metal cathode is not restricted as far as it does not provide any short circuit. For the metal cathode a low resistance metal such as Al, Mg, Cu, Au and the like and an alloy thereof is used.

Figure 9A:
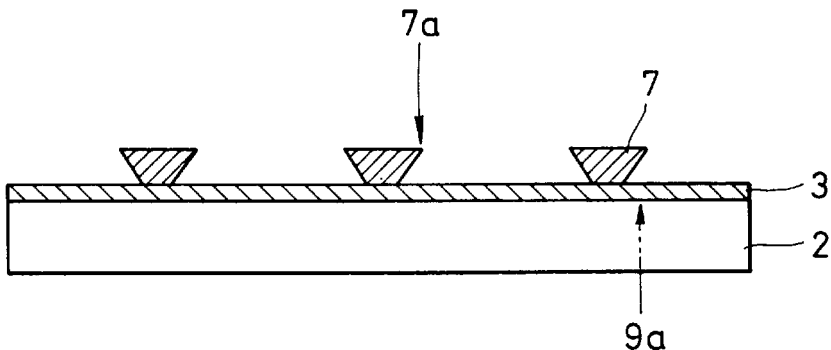
FIGS. 9A, 9B and 9C are cross-section views showing substrates in a process of a first embodiment for manufacturing an organic EL display panel according to the present invention.
Figure 9B:
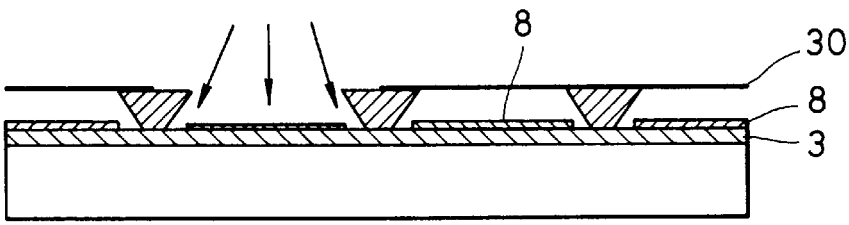
Figure 9C:
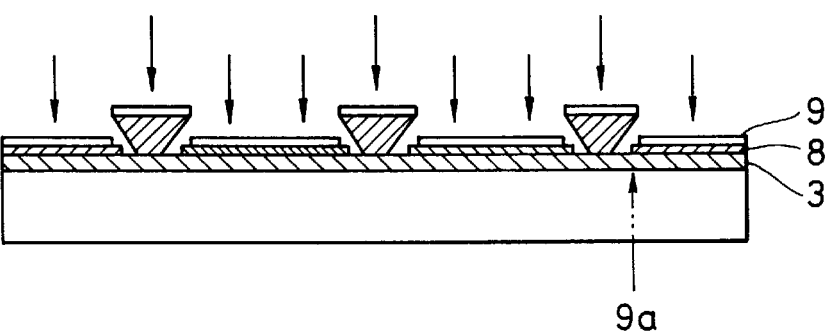

Next, FIGS. 9A to 9C show another embodiment process for an organic EL display panel carrying ramparts of reverse tapered cross-section.

As shown in FIG. 9A, the ITO anode 3 is formed on the substrate with a predetermined pattern. The ramparts 7 each having the reverse tapered cross-section are formed on the substrate 2 in a way that a site 9a to be an edge of the cathode takes shelter from the metal vapor flow vertically dropped later by means of overhanging portion 7a.

As shown in FIG. 9B, by using the shadow mask 30 the RGB organic function layers are formed in turn on the substrate 2 in the same manner mentioned above. Since the shadow mask contacts via the rampart servicing as a spacer to the organic EL medium during the vacuum-deposition, the mask can not damage the organic function layer due to a gap between the shadow mask and the ITO anode or the organic function layer maintained by the rampart. In addition, this vacuum-deposition is performed while the substrate is rotated with respect to an axis extending normally to the surface thereof in order that the EL medium goes around the overhang of the reverse tapered rampart and reaches the base thereof. Instead of the rotation of the substrate, a plurality of vapor sources may be used for entering the EL medium to the root of the reverse tapered rampart from various directions based on the sources. The deposition of EL medium at the root of the rampart is efficient for the wide spread organic function layer preventing a short-circuit between the ITO anode and the cathode formed later.

As shown in FIG. 9C, the cathode material of metal is vacuum-deposited perpendicular to the surface of the substrate. As seen from the figure, the overhanging portion 7a of the reverse tapered rampart interrupts the metal vapor flow from the root adjacent to the site 9a to be a cathode edge. In this way, both the electrical separations of the adjacent cathodes between which the rampart is put and of the ITO anode and the cathode pattern are simultaneously achieved.

Last, after the sealing against moisture is performed, an organic EL full-color display panel is obtained.

Of course, the organic EL full-color display panel may be formed as a monochrome display panel by depositing single color organic function layers, instead of RGB organic function layers of the steps as shown in FIG. 9B and FIG. 8A to 8C. In addition, another EL full-color display panel may be obtained when RGB filters are provided and white color organic function layers are formed on the substrate.

The organic EL display panel according to the present invention does not lose its inherent performance for a long period, since there is no process with probability of damaging the organic function layer such as the wet type photolithography after the formation step of the organic EL layers. In addition, since the cathode is formed with the vertical metal flow, the flexible cathode pattern may be obtained. Further, the reverse tapered rampart may be formed by the photolithography at a fine patterning with a precision of 10 micrometers or less.

The feature of the present invention of the organic EL display panel is the existence of ramparts on the substrate each comprising the overhanging portion and having a T-shaped cross-section or the reverse tapered cross-section at the portion or the whole thereof. The feature of the method according to the present invention is that the organic EL medium material vapor flow goes around the overhanging portion closer to the base of the reverse tapered or T-shaped rampart than the cathode metal material vapor flow.

EXAMPLE 1

An organic EL display panel was fabricated in that the rampart on the substrate was made of a photoresist of chemically amplified type.

Figure 10:
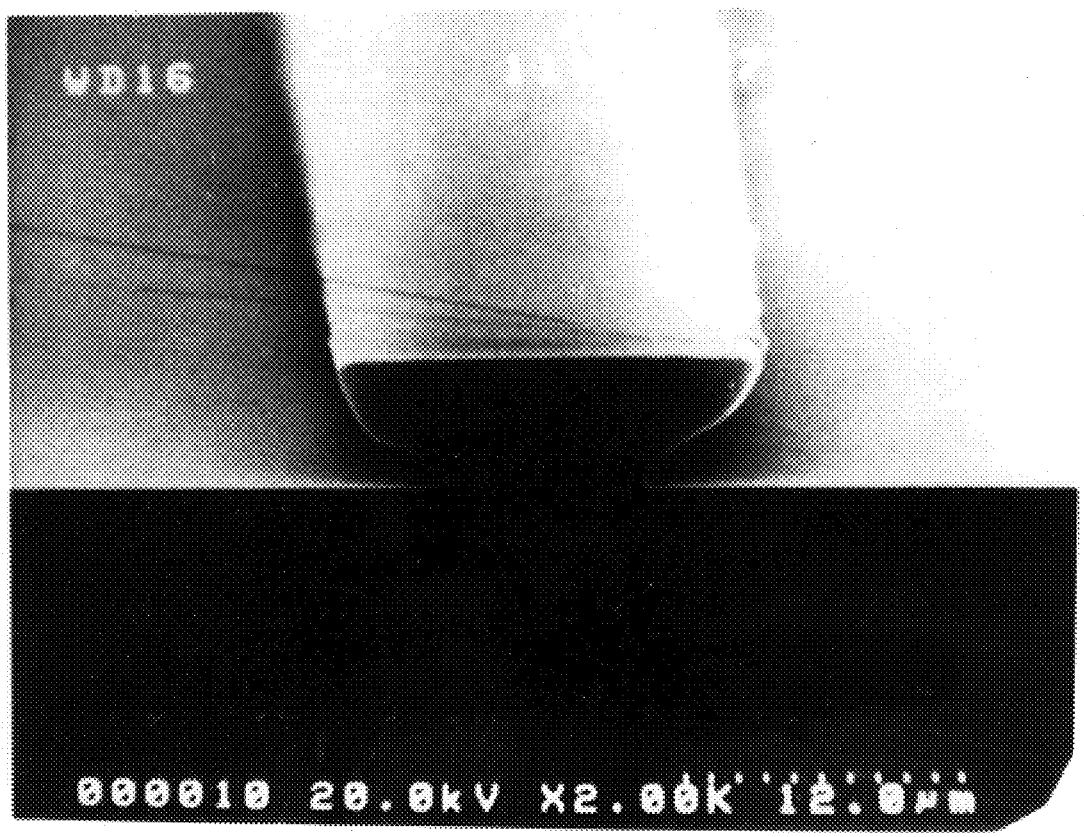
FIG. 10 is a scanning electron microphotograph showing a rampart on the substrate in the first embodiment of an organic EL display panel according to the present invention.

ITO anodes were patterned in the stripe form on a glass substrate, and then the substrate was sufficiently washed. The nega-photoresist LAX-1 (available from Nippon Zeon Co. ltd.) was spin-coated at a thickness of 5.6 micrometers as a layer on the substrate. Then, the coated substrate was pre-baked in a warm air current circulatory oven. After that, a photo mask providing parallel slits for cathodes each width of 20 micrometers was put on the photoresist layer in a manner that the slits extends perpendicular to the ITO stripes. Then, the photoresist layer was exposed with a pertinent radiation through the slits of the photo mask. Subsequently, the photoresist layer was performed with P.E.B in the warm air current circulatory oven and was developed, so that reverse tapered ramparts each having a width of 20 micrometers and a height of approximately 5.6 micrometers were formed (see FIG. 10 showing a scanning electron microphotograph of the rampart).

After a shadow mask provided with openings each corresponding to a recess between ramparts was put on the ramparts, N,N'-diphenyl-N-N'-bis(3-methylphenyl)-1,1'-biphenyl-4,4'-diamine (so-called "TPD") was vacuum-deposited at a 700 angstroms thickness through the openings onto the surface carrying the ramparts while the substrate was rotated with respect to an axis extending normally to the surface thereof, in order that the EL medium goes around the overhang of the reverse tapered rampart and reaches the base thereof. Subsequently, Aluminum oxine chelate (hereinafter referred as "$Alq_3$") was vacuum-deposited at a 550 angstroms thickness in the same manner. After the depositions, the substrate was stopped to rotate. Aluminum was vacuum-deposited at a 1000 angstroms as cathodes in a manner that Al vapor flow is perpendicular to the substrate (see FIG. 11 of a scanning electron microphotograph showing portions adjacent to the rampart).

Figure 11:
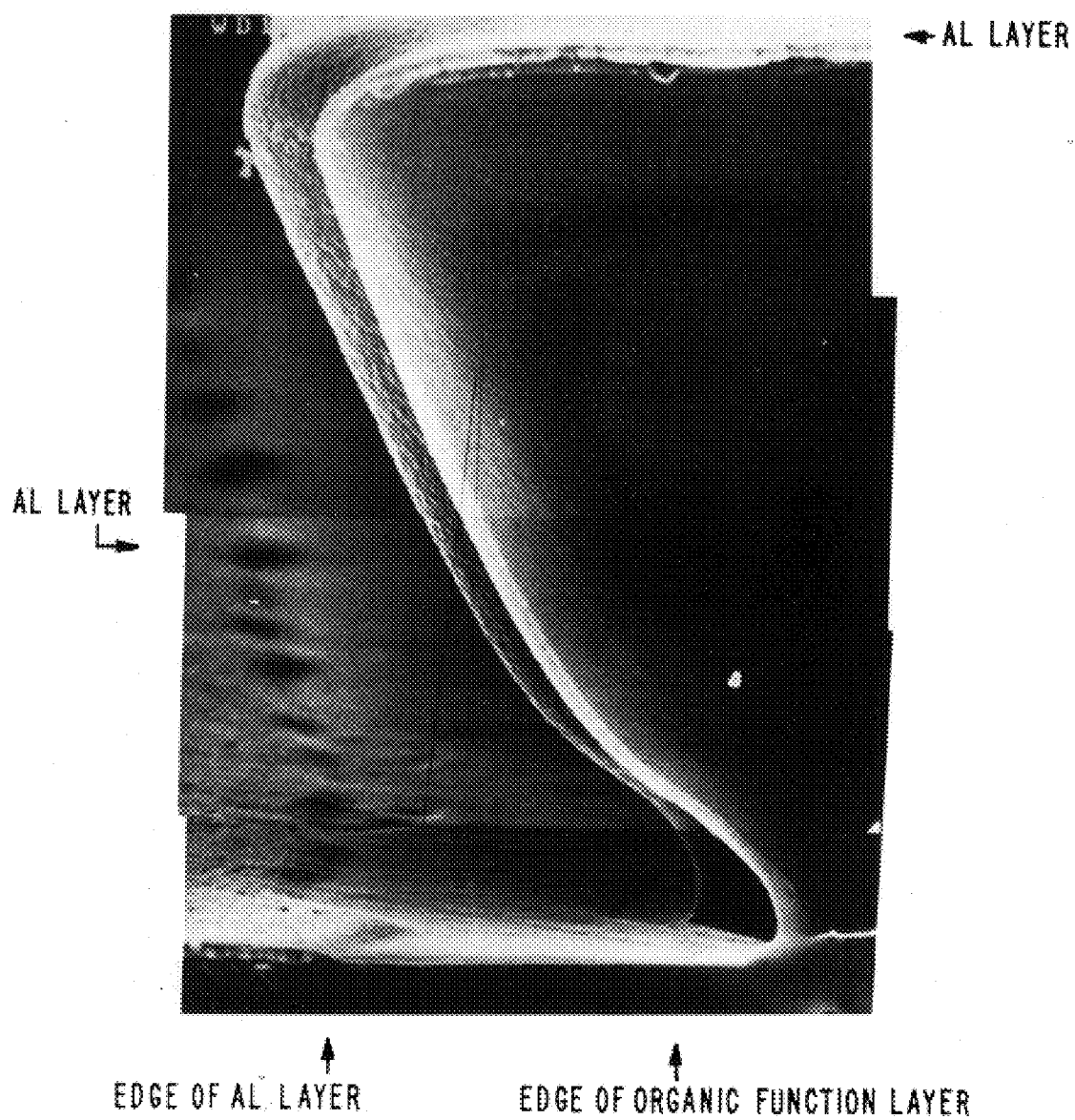
FIG. 11 is a scanning electron microphotograph showing an organic function layer and an Al electrode adjacent to a rampart on the substrate in the first embodiment of an organic EL display panel according to the present invention.

As seen from FIG. 11, the Al layer on the top of the rampart is divided from that of on the substrate at the edge of the Al cathode layer on the substrate near the base of the rampart, so that the adjacent Al cathode lines formed on the substrate are electrically disconnected to one another. In addition, the edge of the organic function layer comprising TPD and $Alq_3$ sticks out from the edge of the Al cathode layer, so that any short-circuit between the Al cathode and the ITO anode does not occur.

EXAMPLE 2

Another organic EL display panel was fabricated in that the rampart of a photoresist on the substrate was treated with $C_6H_5Cl$.

Figure 12:
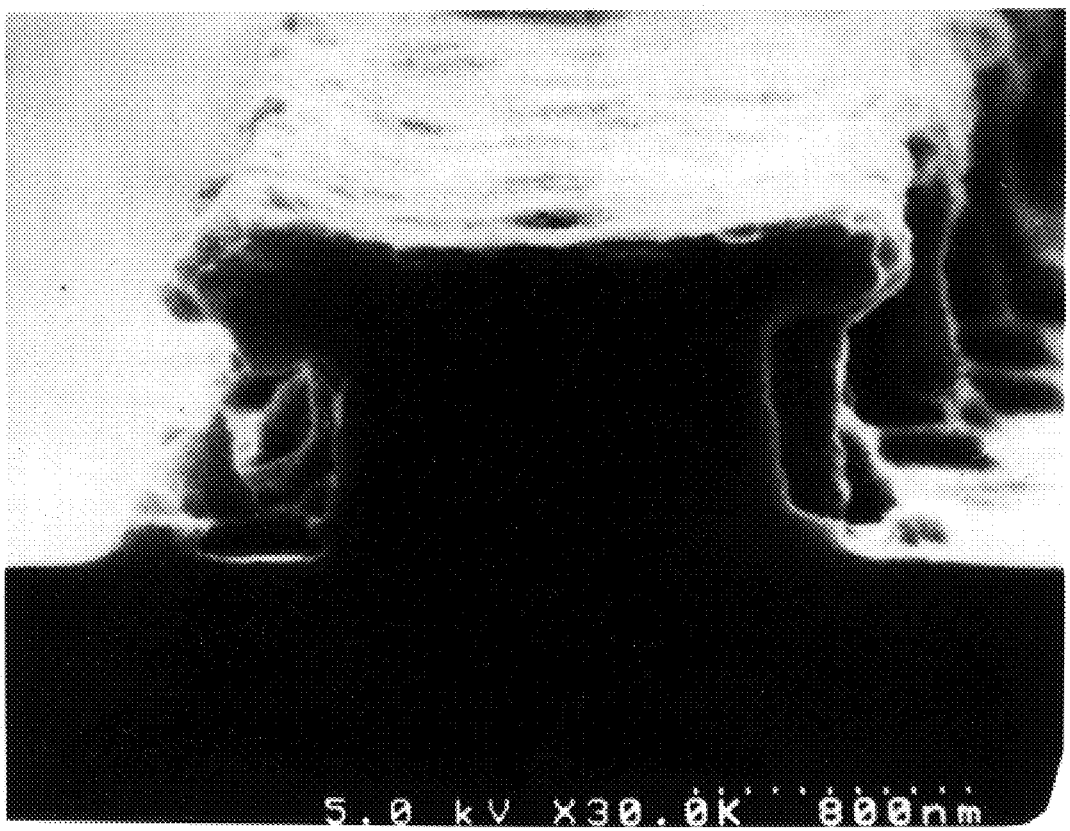
FIG. 12 is a scanning electron microphotograph showing a rampart on the substrate in a second embodiment of an organic EL display panel according to the present invention.

ITO anodes were patterned in the stripe form on a glass substrate, and then the substrate was sufficiently washed. The posi-photoresist AZ6112 (available from Hoechst Japan Ltd.) was spin-coated at a thickness of approximately one micrometer as a layer on the substrate. Then, the coated substrate was pre-baked in a warm air current circulatory oven. After that, the coated substrate was dipped into a $C_6H_5Cl$ fluid at a temperature of 32° C. for 30 minutes. Then, a photo mask providing parallel slits for cathodes each width of 2 micrometers was put on the photoresist layer in a manner that the slits extends perpendicular to the ITO stripes. Then, the photoresist layer was exposed with a pertinent radiation through the slits of the photo mask. Subsequently, the photoresist layer was developed, so that reverse tapered ramparts each having a width of 2 micrometers and a height of approximately one micrometer were formed (see FIG. 12 showing a scanning electron microphotograph of the rampart).

Next, an organic function layer comprising TPD and $Alq_3$ and an Al cathode layer were formed in the same manner that of EXAMPLE 1.

As a result, the Al layer on the top of the rampart was divided from that of on the substrate at the edge of the Al cathode layer on the substrate near the base of the rampart, so that the adjacent Al cathode lines formed on the substrate were electrically disconnected to one another. In addition, the edge of the organic function layer comprising TPD and $Alq_3$ stuck out from the edge of the Al cathode layer, so that any short-circuit between the Al cathode and the ITO anode did not occur.

According to the present invention, it makes sure of automatically completely patterning of the cathode lines without use of the photolithography for the cathode patterning, since the Al layer on the top of the rampart with overhanging portions is electrically separated from that of on the substrate during the vacuum deposition. In addition, the film formation of the organic function layer with using the rampart and the shadow mask put thereto realizes an available separation of the organic function layers, so that a colorful fine full color display panel comprising organic function layers is manufactured without deterioration of the organic function layer nor any leakage of EL medium to adjacent pixels. The number of the steps in the manufacturing is therefore reduced than those of the prior art, the separation of the RGB organic function layers is surely achieved so that the RGB media are shared with a high precision.

EXAMPLE 3

Figure 13:
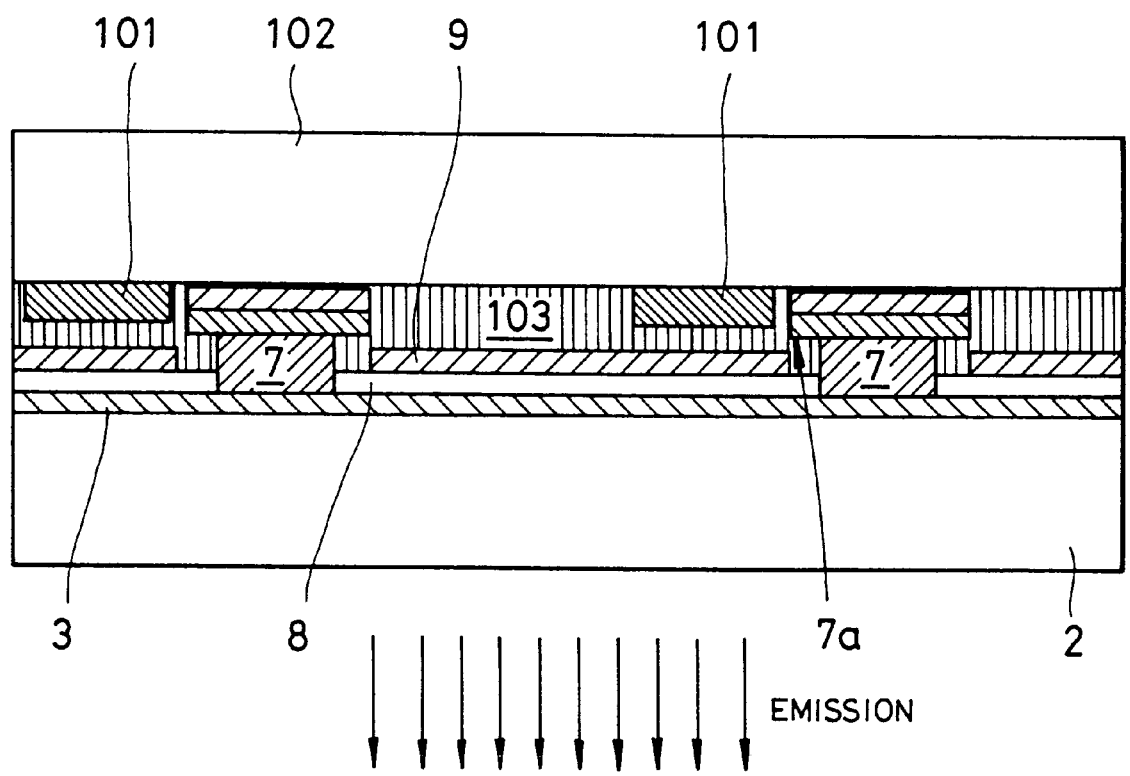
FIG. 13 is an enlarged cross-section view of a third embodiment of an organic EL display panel according to the present invention.

Another full color display panel in which nonlinear elements each including thin film transistors (TFT) and capacitors connected to the second display electrodes is fabricated together with scan signal lines and data signal lines on the substrate as shown in FIG. 13. As seen from the figure, ITO anode layers 3, organic function layers 8 and second display electrodes 9 are previously formed on a glass substrate 2 as a front substrate in the same manner as the forgoing embodiments. Individually, a back glass substrate 102 carrying nonlinear elements 101 connected to the second display electrodes 9 and the scan data signal lines are formed correspondingly to the number of predetermined pixels. Thus, an anisotropic conductive adhesive 103 adheres both the front and back substrates so that the nonlinear elements 101 are electrically connected only to the corresponding second display electrodes 9 respectively to result in a flat display panel.

In the formation of the TFT EL flat display panel, it should be noted that individual cathode and organic function layer precisely corresponds separately to each emitting portion of the pixel, and further one of the cathode is perfectly insulative electrically to the adjacent cathode. This requirement is achieved by another embodiment of the present invention that the T-shaped cross-section or reverse tapered ramparts with overhanging portion are formed in the form of a two dimension matrix.

In addition, the present invention realizes an organic electroluminescent display panel and method for manufacturing the same which are capable not only of being manufactured with a freely flexible patterning without deterioration of the organic function layer, cathode and other elements, but also of preventing any puncture of the first and second display electrodes and the organic function layer with a high yield rate in the production thereof. Namely, in Example 4, at least one insulative layer is inserted between the first and second display electrodes under the overhanging portion of the rampart. In Example 5, the ramparts and the second display electrodes are covered with an insulative sealing film.

EXAMPLE 4

Addition of an Insulative Layer

There are manufactured an organic EL display panel including insulative layers preventing the short-circuit between the first and the second display electrodes, particularly at the edge of the second display electrode.

As shown in FIG. 14A, after the first display electrodes 3 (ITO anodes) are previously formed in the predetermined pattern on the substrate, insulative layers 40 are formed on the sites planned to be at edges of the second display electrodes formed later.

As shown in FIG. 14B, the ramparts 7 each having the reverse tapered cross-section are formed on the insulative layers 40 and the substrate 2 in a way that each overhanging portion 7a of the ramparts 7 covers the insulative layer at the site planned to be at edges of the second display electrodes formed later. The insulative layers 40 are formed on gaps between the second display electrodes or patterns to define the shape of the second display electrode.

As shown in FIG. 14C, by using the shadow mask 30 with the predetermined openings, the RGB organic function layers are formed in turn on the rotating substrate 2 in the same manner mentioned above. The shadow mask is contacted to the ramparts apart from the organic function layers during the vacuum-deposition. The mask thus did not damage the organic function layer.

As shown in FIG. 14D, the cathode metal material is vacuum-deposited as a whole to the surface of the substrate. This vacuum-deposition is performed by the angle θ less than a tapering angle θ' (θ<θ') of the reverse tapered rampart with respect an axis extending normally to the substrate. The overhanging portion 7a of the reverse tapered rampart interrupted the metal vapor flow from the root adjacent to the site to be a cathode edge, so that there are simultaneously achieved both the electrical separations of the adjacent cathodes between which the rampart is placed and of the ITO anode and the cathode. In addition, There is no short-circuit between the edges of the cathode i.e., the second display electrode and the previously formed ITO anode even when the deposited metal cathode crosses over the edge of the organic function layer because of the insulative layer 7 formed in the step of FIG. 14A.

Last, after the sealing against moisture is performed, an organic EL full-color display panel is obtained.

A monochrome EL display panel may be obtained if deposition of single color organic function layers are deposited, instead of RGB organic function layers of the steps as shown in FIG. 14C. In addition, another EL full-color display panel may be obtained when RGB filters are provided and white color organic function layers are formed on the substrate.

Figure 15:
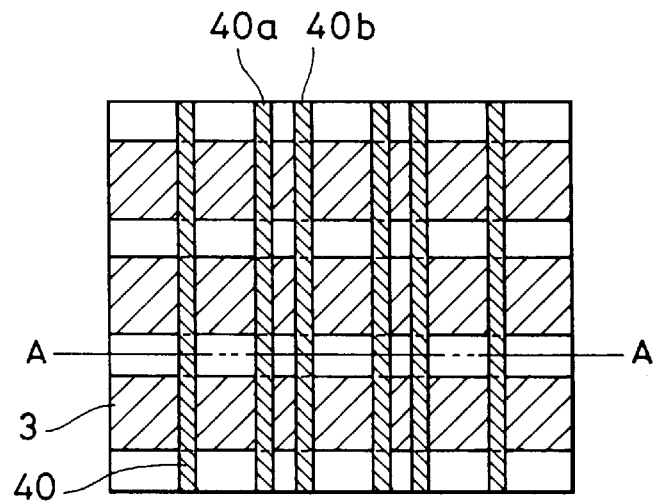
FIG. 15 is a partially enlarged plan view of the substrate in the fourth embodiment for manufacturing an organic EL display panel according to the present invention.
Figure 16:
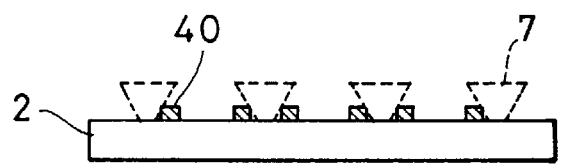
FIG. 16 is a cross-section view of a portion taken in line AA of FIG. 15.
Figure 17:
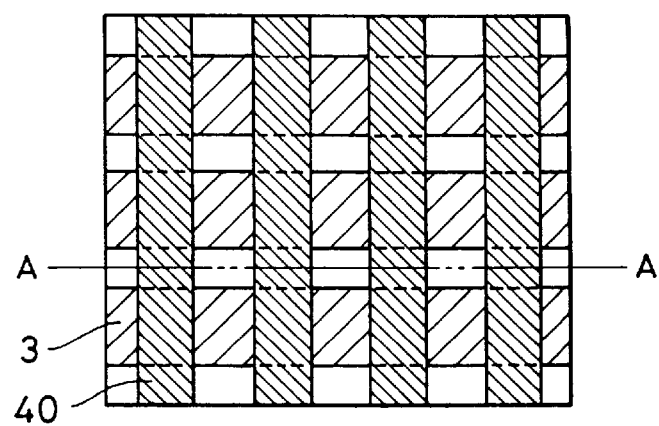
FIG. 17 is a partially enlarged plan view of the substrate in the fourth embodiment for manufacturing an organic EL display panel according to the present invention.
Figure 18:
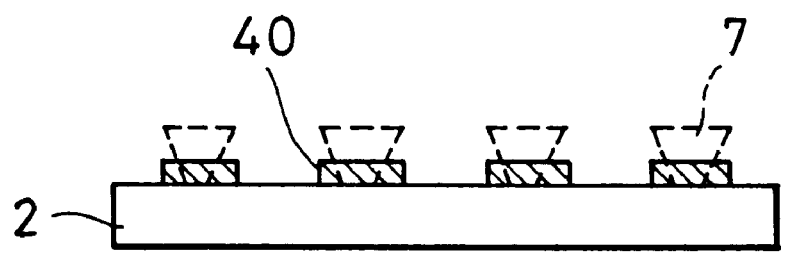
FIG. 18 is a cross-section view of a portion taken in line AA of FIG. 17.
Figure 19:
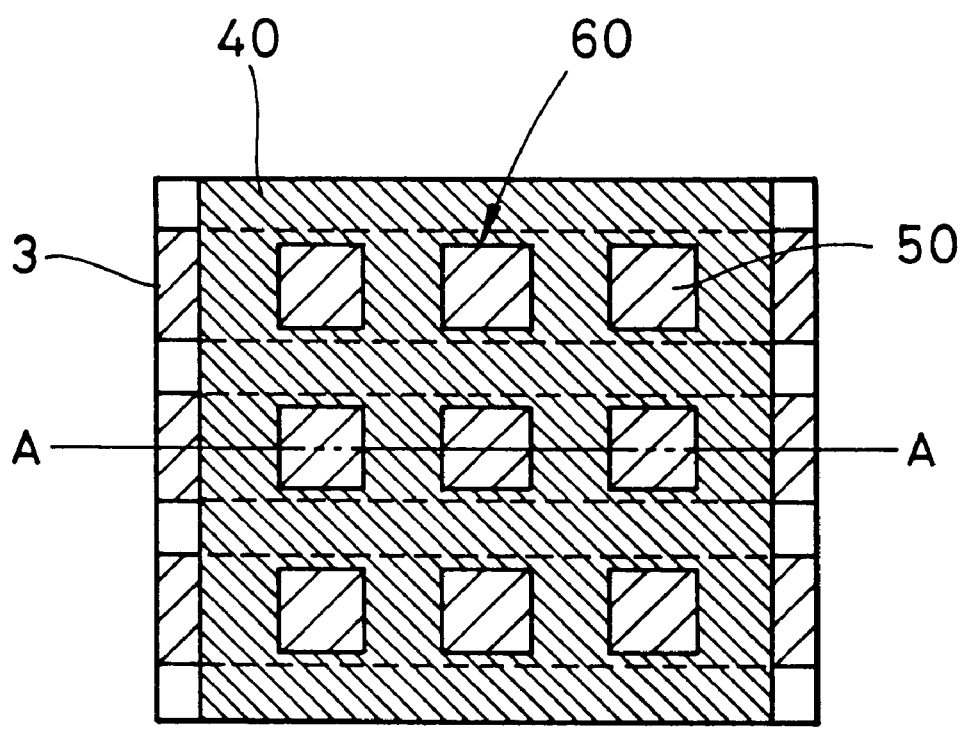
FIG. 19 is a partially enlarged plan view of the substrate in the fourth embodiment for manufacturing an organic EL display panel according to the present invention.

The area range of each insulative layer formed in the step of FIG. 14A is at least each edge portion (FIG. 15) of the adjacent second display electrodes and further at most the surface of the substrate other than emitting portion of displaying dots (segments) (see FIG. 19). For example, FIG. 15 shows the pattern of the insulative layers 40 in the insulative layer formation step of FIG. 14A in which a pair of the parallel insulative layer stripes 40a and 40b extending vertical to the first display electrode 3. In this case, these parallel insulative layer stripes 40a and 40b are formed as sandwiching the base of the rampart 7 as shown in FIG. 16. In another embodiment, the integrated insulative layers 40 may be formed so as to combine those parallel insulative stripes of FIG. 15 extending vertical to the first display electrode 3 as shown in FIG. 17. In this case, the ramparts 7 are formed along the center line of each integrated insulative layer 40 as shown in FIG. 18. In further anther embodiment, the insulative layer may be formed so as to combine those vertical and lateral insulative stripes as shown in FIG. 19. That is, the insulative layer is formed on the surface of the substrate other than the exposed portions 50 of the first display electrode and the edge portions 60 of the first display electrodes. As a result, the insulative layer also prevents the short-circuit between the edge of the first display electrode and the second display electrode.

The organic EL display panel according to this embodiment maintains its inherent performance for a long period after the production, therefore a high yield rate of the production, since there is no process with probability of damaging the organic function layer such as the wet type photolithography after the formation step of the organic EL layers. In addition, since the direction of the deposition of the second display electrode is free, a variety of second display electrode patterns are achieved. In addition, the insulative layer placed between the edge of the second display electrode and the first display electrode prevents the short-circuit therebetween. Moreover, the reverse tapered rampart and the insulative layer may be formed by the photolithography at a fine patterning with a precision of 10 micrometers or less.

Concretely, an organic EL display panel including the insulative layer placed between the edge of the second display electrode and the first display electrode was manufactured in substantially the same manner as Example 1 above mentioned, in which the insulative layer formation step was inserted between the first display electrode step and the rampart formation step.

ITO anodes were patterned in the stripe form on a glass substrate, and then the substrate was sufficiently washed. The photoresist OFPR-8000 (available from Tokyo Ohka Co. ltd.) was spin-coated at a thickness of one micrometer as an insulative layer on the substrate. Then, the coated substrate with the insulative layer was pre-baked in the warm air current circulatory oven. After that, a photo mask providing parallel slits for cathodes each width of 20 micrometers was put on the photoresist insulative layer in a manner that the slits extends perpendicular to the ITO stripes. Then, the photoresist layer was exposed with a pertinent radiation through the slits of the photo mask. Subsequently, the photoresist layer was developed and rinsed and then post-baked in the warm air current circulatory oven. In this way, the stripe insulative layer 40 as shown in FIG. 17 were formed.

Next, the nega-photoresist LAX-1 (available from Nippon Zeon Co. ltd.) was spin-coated at a thickness of 5.6 micrometers as a layer on the substrate. Then, the coated substrate was pre-baked in a warm air current circulatory oven. After that, a photo mask providing parallel slits for cathodes each width of 18 micrometers was put on the photoresist layer in a manner that both the center lines of each insulative layer and each stripe slit of the photo mask (the line width 18 micrometers) are coincides with each other. Then, the photoresist layer was exposed with a pertinent radiation through the slits of the photo mask. Subsequently, the photoresist layer was performed with P.E.B in the warm air current circulatory oven and was developed, so that reverse tapered ramparts each having a width of 18 micrometers and a height of approximately 5.6 micrometers were formed. The tapering angle θ' of the reverse tapered rampart in respect to the normal line of the substrate was measured to be approximately 30 degree.

Figure 20:
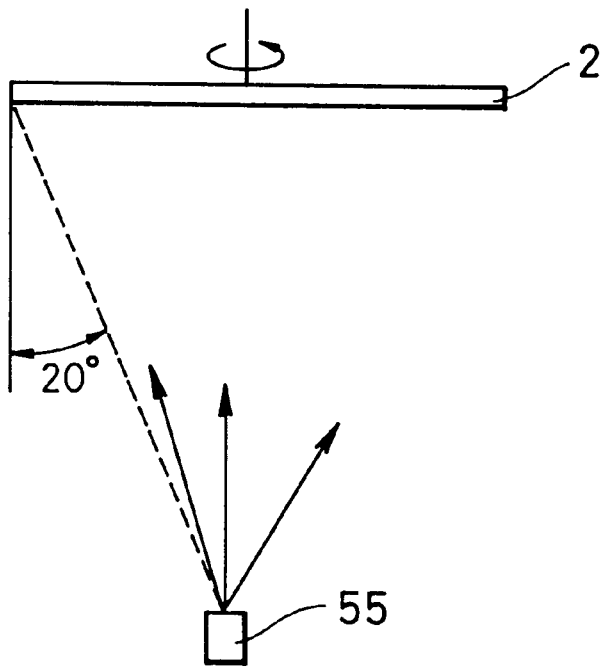
FIG. 20 is a schematic diagram showing an arrangement of the substrate and a vapor source in the fourth embodiment for manufacturing an organic EL display panel according to the present invention.

Next, the substrate 2 was fixed to the turntable provided in the vacuum chamber of the vacuum deposition device in the form shown in FIG. 20, and then the vacuum chamber was exhausted up to a pressure of $-5 \times 10^{-6}$ Torr and then the vacuum deposition was performed with a resistance heating method while the substrate was rotated with respect to an axis extending normally to the surface thereof. Under this condition TPD was vacuum-deposited at a 700 angstroms thickness. Subsequently, $Alq_3$ was vacuum-deposited at a 550 angstroms thickness in the same manner. Further, the second display electrode of Al was vacuum-deposited at a 1000 angstroms thickness. In these cases each of the material vapor sources 55 corresponding the steps was placed under the substrate 2 and therefore the vapor flow biased by the angle θ=20 degree at maxim from the normal line of the substrate less than tapering angle θ'=30 degree the reverse tapered rampart. There was no measured the conductivity cross the adjacent Al lines between which the rampart exists so that a perfect electrical insulation was complete. In addition, upon application of 10 Volts across the ITO and Al electrodes of the resultant display panel, the selected organic function layers emitted a green light at a high luminance but not occurs any short-circuit therebetween.

EXAMPLE 5

Addition of an Insulative Sealing Film

An insulative sealing film is formed as surrounding the reverse tapered rampart and covering entirely the second display electrode pattern. A substrate carrying the second display electrodes is previously formed through the steps shown in FIGS. 14A to 14D in the same manner of Example 4. The substrate is covered with an insulative sealing film 45 with a high damp-proof effect by using the vacuum deposition while the substrate is rotated, sputtering or CVD method.

Figure 21:
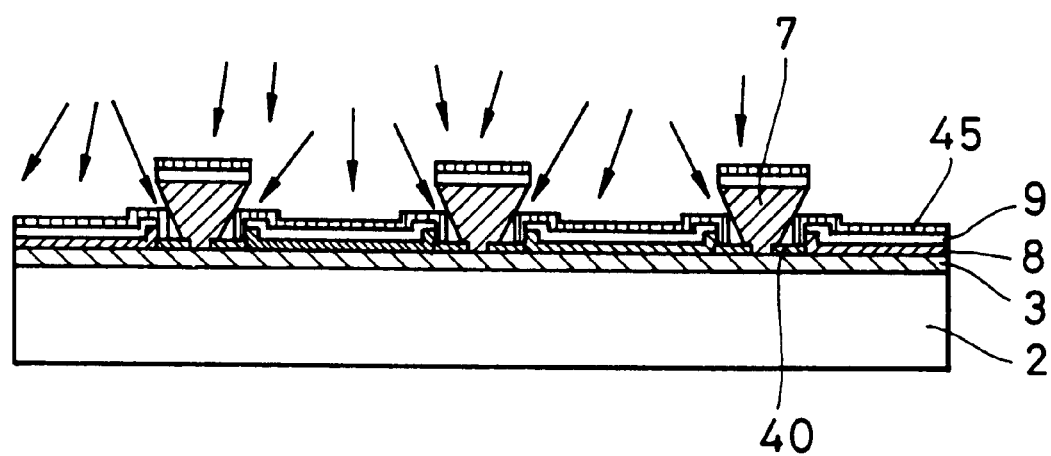
FIG. 21 is a cross-section view showing a substrate in a process of a fifth embodiment for manufacturing an organic EL display panel according to the present invention.
Figure 22:
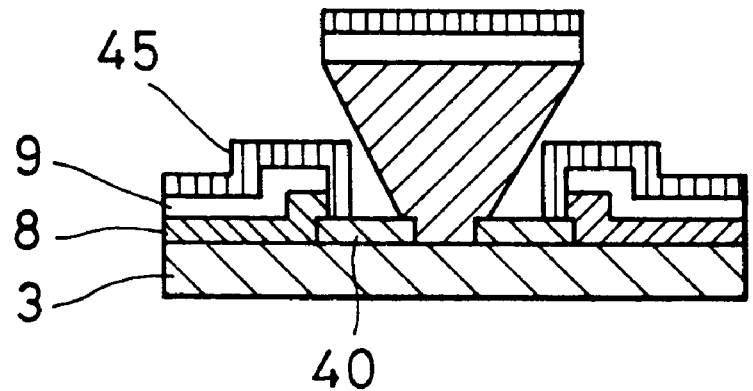
FIGS. 22, 23, 24 and 25 are enlarged cross-section views each showing a rampart and adjacent thereto on the substrate in a process of the fifth embodiment for manufacturing an organic EL display panel according to the present invention.
Figure 23:
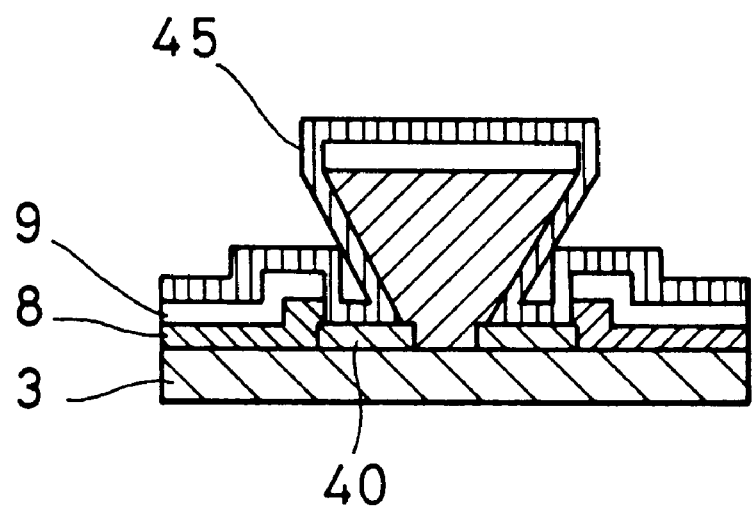

The insulative sealing film is deposited in such a manner that the sealing material vapor goes around the over hanging portion toward the tapered side walls and the base of the reverse tapered rampart 7 as shown in FIG. 21. Therefore, the sealing material vapor reaches at the insulative layer 40 as shown in FIG. 22, so that the second display electrode lines 9 are perfectly covering the insulative sealing film 45. In addition, the insulative sealing film 45 may cover the tapered side walls of the reverse tapered rampart 7 as shown in FIG. 23. As far as the insulative layer 40 covers at least the second display electrode lines, the form thereof is not restricted.

Figure 24:
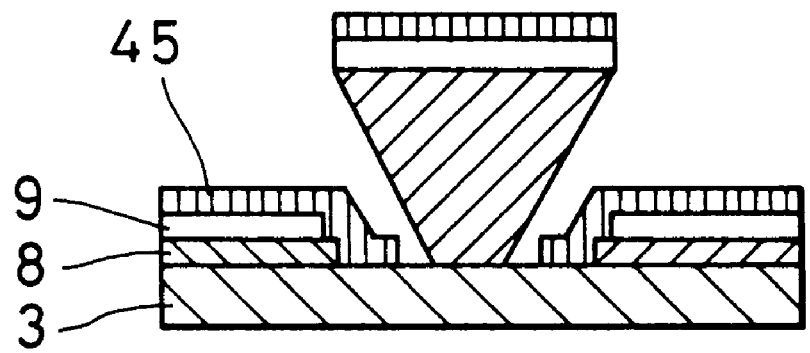
Figure 25:
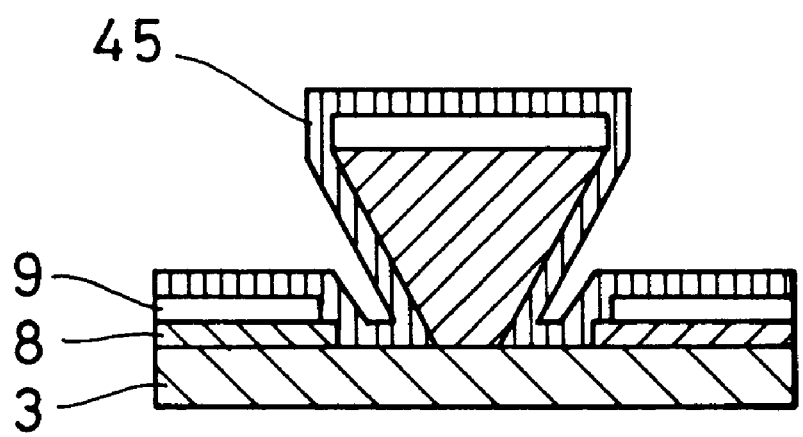

Moreover, this sealing structure may be applied to the above mentioned Examples as well as Example 4 in which no insulative layer is formed in the panel. As shown in FIG. 24, the insulative sealing film is deposited in such a manner that the sealing material vapor goes around the over hanging portion toward the base of the reverse tapered rampart 7, so that the edges of the second display electrode 9 and the organic function layer 8 and the surface portion of the first display electrode 3 on the substrate are covered with the insulative sealing film 45. Alternatively, as shown in FIG. 25, all of the second display electrode lines 9, the reverse tapered rampart 7 including the tapered side walls and the like may be perfectly covered the insulative sealing film 45.

The present invention prevents non-emitting portions or dark spots growing or entering from the edge of the second display electrode to the organic function layer, since the insulative sealing film for perfectly covering the second display electrode pattern. In other words, the organic EL display panel according to the present invention has a very high durability.

Concretely, an organic EL display panel including the insulative layer and the insulative sealing film was manufactured in substantially the same manner as Example 4 above mentioned, in which the insulative sealing film formation step was added after the second display electrode formation step.

A substrate carrying the Al display electrodes was previously formed through steps in the same manner as Example 4. After that, by using the sputtering method, a $SiO_2$ layer was deposited as an insulative sealing film at a one micrometer thickness. There was no measured conductivity between the adjacent Al lines between which the rampart exists so that a perfect electrical insulation was complete. In addition, upon application of 10 Volts across the ITO and Al electrodes of the resultant display panel, the selected organic function layers emitted a green light at a high luminance without producing any short-circuit therebetween. Furthermore, the resultant display panel did not have non-emitting portions in the organic function layer nor expansion thereof for a long period of several days in the air.

According to the present invention, the following advantageous effects are obtained.

(1) After the formation of the organic EL layers, it is unnecessary to perform a step with probability of damaging the organic function layer such as the photolithography. Due to existence of the ramparts, the protection of the organic function layer is stable and the damage of the layers is reduced.

(2) The number of the steps in the manufacturing is reduced relative to those of the prior art, the separation of the RGB organic function layers is surely achieved so that the RGB media are shared with a high precision.

(3) A freely flexible patterning on the substrate is realized without deterioration of the organic function layer, cathode and other elements.

It should thus be apparent that the scope of the teaching of this invention is not intended to be limited by only the embodiments that have been expressly disclosed and illustrated, but that instead the scope of the teaching of this invention should be read as being commensurate with the scope of the claims that follow.

What is claimed is:

1. A method for manufacturing an organic electroluminescent display panel having a plurality of emitting portions comprising the steps of:

forming a plurality of first display electrodes corresponding to emitting portions on a substrate;

forming, on the substrate, electrically insulative ramparts for exposing at least portions of the first display electrodes, each said electrical insulation rampart protruding from the substrate and having an overhanging portion projecting in a direction parallel to the substrate;

depositing organic electroluminescent media onto exposed portions of the first display electrodes respectively, thereby forming a plurality of organic function layers each including at least one organic electroluminescent medium on the first display electrodes; and forming a plurality of second display electrodes on the organic function layers.

2. A method as set forth in claim 1, wherein said rampart formation step comprises the steps of:

forming a rampart material layer over a first surface of said substrate;

forming a resist mask with predetermined pattern openings on the rampart material layer;

etching the rampart material layer through the openings of the resist mask by using a dry-etching or wet-etching, thereby forming the ramparts having said overhanging portions.

3. A method as set forth in claim 1, wherein the organic electroluminescent media depositing step comprises the steps of:

putting a shadow mask onto top surfaces of the ramparts, the shadow mask having a plurality of openings corresponding to the exposed portions of the first display electrodes, while aligning the openings to the first display electrodes respectively;

depositing organic electroluminescent media through the openings onto the first display electrodes between the ramparts respectively; and repeating the mask putting and aligning step and the media depositing step in such a manner that the shadow mask is shifted to an adjacent portion where the openings are aligned to adjacent other first display electrodes.

4. A method as set forth in claim 1, further comprising:

between said step of forming said first display electrodes and said rampart formation step, forming insulative layers on portions of the first display electrodes to be under at least one of said overhanging portions and edges of the exposed portions of the first display electrodes.

5. A method as set forth in claim 4 and further comprising: after said step of forming the second display electrodes, forming an insulative sealing film on at least the second display electrodes.

6. A method as set forth in claim 1 and further comprising: after said step of forming the second display electrodes, forming an insulative sealing film on at least the second display electrodes.

7. A method as set forth in claim 1 and further comprising: after said step of forming the second display electrodes, forming an insulative sealing film on at least the organic function layers.

8. A method as set forth in claim 1, wherein the overhanging portion projects in the direction parallel to the substrate at an end of said rampart that is directed away from said substrate.

* * * * *